(12) United States Patent
Zhao et al.

(10) Patent No.: US 12,266,911 B2
(45) Date of Patent: Apr. 1, 2025

(54) INVERTER JUNCTION BOX

(71) Applicant: Jing-Jin Electric Technologies Co., Ltd., Beijing (CN)

(72) Inventors: Xiang Zhao, Beijing (CN); Hao Zhang, Beijing (CN); Gabriel Gallegos Lopez, Beijing (CN)

(73) Assignee: JING-JIN ELECTRIC TECHNOLOGIES CO., LTD., Beijing (CN)

( * ) Notice: Subject to any disclaimer, the term of this patent is extended or adjusted under 35 U.S.C. 154(b) by 222 days.

(21) Appl. No.: 17/997,845

(22) PCT Filed: Feb. 5, 2021

(86) PCT No.: PCT/CN2021/075551
§ 371 (c)(1),
(2) Date: Nov. 3, 2022

(87) PCT Pub. No.: WO2021/244062
PCT Pub. Date: Dec. 9, 2021

(65) Prior Publication Data
US 2023/0170680 A1    Jun. 1, 2023

(30) Foreign Application Priority Data
Jun. 2, 2020 (CN) .......................... 202020979078.3

(51) Int. Cl.
*H02G 3/08* (2006.01)
*H01R 9/24* (2006.01)
(Continued)

(52) U.S. Cl.
CPC .............. *H02G 3/085* (2013.01); *H01R 9/24* (2013.01); *H01R 13/713* (2013.01); *H02M 7/003* (2013.01)

(58) Field of Classification Search
CPC ...................................................... H02G 3/085
(Continued)

(56) References Cited

U.S. PATENT DOCUMENTS

| | | | |
|---|---|---|---|
| 4,747,791 A | 5/1988 | Nishio | |
| 4,897,598 A * | 1/1990 | Doemens | G01R 1/07371 324/763.01 |

(Continued)

FOREIGN PATENT DOCUMENTS

| | | |
|---|---|---|
| CN | 2264389 A | 10/1997 |
| CN | 101913328 A | 12/2010 |

(Continued)

OTHER PUBLICATIONS

Extended European Search Report in EP21816718.7, mailed Oct. 10, 2023, 4 pages.
Office Action in EP21816718.7, mailed Nov. 6, 2023, 23 pages.
PCT International Search Report mailed Apr. 23, 2021, issued in PCT Application No. PCT/CN2021/075551.

*Primary Examiner* — Stanley Tso
(74) *Attorney, Agent, or Firm* — ARENTFOX SCHIFF LLP

(57) ABSTRACT

An inverter junction box is provided that includes a cover plate and a knockout pin. The cover plate is detachably connected with a top part of a casing; the knockout pin has one end that is detachably connected with a bottom part of the cover plate, and another end that can abut against a protection device on an inverter. One side of the casing has a connecting part that is connected with an external cable. A bottom part of the casing is a hollow structure and abuts against an incoming terminal of the inverter.

9 Claims, 3 Drawing Sheets

(51) Int. Cl.
*H01R 13/713* (2006.01)
*H02M 7/00* (2006.01)

(58) Field of Classification Search
USPC .......................................... 174/520
See application file for complete search history.

(56) References Cited

U.S. PATENT DOCUMENTS

| | | | | |
|---|---|---|---|---|
| 11,557,806 | B2* | 1/2023 | Chung | H01M 50/20 |
| 2015/0224886 | A1* | 8/2015 | Kakizaki | E02F 9/0858 |
| | | | | 361/823 |
| 2020/0020914 | A1* | 1/2020 | Fukushima | H01M 50/507 |
| 2020/0411924 | A1* | 12/2020 | Yun | H01M 50/298 |

FOREIGN PATENT DOCUMENTS

| | | | |
|---|---|---|---|
| CN | 202169876 | U | 3/2012 |
| CN | 103812062 | A | 5/2014 |
| CN | 110829100 | A | 2/2020 |
| CN | 212435595 | U | 1/2021 |
| CN | 212436067 | U | 1/2021 |
| EP | 2725663 | A1 | 4/2014 |
| JP | 2008218094 | * | 3/2007 |
| JP | 2008218094 | A | 9/2008 |
| WO | WO2018/170905 | * | 3/2017 |
| WO | 2018170905 | A1 | 9/2018 |

* cited by examiner

INVERTER JUNCTION BOX

CROSS-REFERENCE TO RELATED APPLICATIONS

This application is a National Phase of PCT/CN2021/075551, filed on Feb. 5, 2021, which claims priority to Chinese Patent Application No. 202020979078.3, filed on Jun. 2, 2020, the disclosures of each of which are hereby incorporated by reference in their entireties.

TECHNICAL FIELD

The present disclosure relates to the technical field of wire connection, and more particularly, to an inverter junction box.

BACKGROUND

In recent years, with the continuous development of power electronics, in order to meet the market demand and create technological breakthroughs, there are very strict restrictions on designing the high-voltage harness direction of the automobile inverter in the layout of the whole vehicle. In the conventional inverters, the high-voltage harness direction is single, which cannot meet the multi-directional wiring requirements and cannot realize the high-voltage protection function.

Therefore, it is necessary to provide a junction box which can not only meet the multi-directional wiring requirements, but also realize the high-voltage protection function.

SUMMARY

In view of the above problems, the present disclosure proposes an inverter junction box to solve or partially solve the above problems.

In order to achieve the above object, the technical solutions of the present disclosure are as follows:

The present disclosure provides an inverter junction box. The inverter junction box comprises a casing, a cover plate and a knockout pin, wherein the cover plate is detachably connected with a top part of the casing;

one end of the knockout pin is detachably connected with a bottom part of the cover plate, and the other end of the knockout pin can abut against a protection device on the inverter;

one side of the casing is provided with a connecting part that is connected with an external cable;

a bottom part of the casing is a hollow structure and abuts against an incoming terminal of the inverter.

Further, the inverter junction box further comprises a high-voltage busbar terminal;

wherein the high-voltage busbar terminal comprises an insulating body and two conductive columns, and the conductive columns are respectively inserted in the insulating body.

Further, the conductive column is made of copper.

Further, a through hole is provided in a central part of the conductive column, and the high-voltage busbar terminal can be connected to the incoming terminal of the inverter via the through hole and a bolt.

Further, the casing is further provided therein with a positioning plate for fixing the insulating body and the knockout pin at a middle position of the casing.

Further, the casing has a cylindrical shape or a regular quadrangular prism shape as a whole, the insulation body extends along a diameter of the cylindrical shape or a diagonal of the regular quadrangular prism shape with two ends abutting against the casing, and the two conductive columns are symmetrically provided on the diameter or the diagonal.

Further, outer end sides of the high-voltage busbar terminal are provided with a number of insulating medium support protrusions.

Further, the connecting part and the casing are arranged to be perpendicular to each other, the connecting part is provided therein with a positive connecting hole and a negative connecting hole, and the positive connecting hole and the negative connecting hole are communicated with an interior of the casing.

Further, the casing is provided thereon with a number of longitudinally penetrating installation holes, and the cover plate is also provided with installation holes at corresponding positions.

Further, the casing is provided thereon with a positioning hole engaging with a positioning column on the inverter, or the casing is provided with a positioning column engaging with a positioning hole on the inverter.

The above inverter junction box has the following advantages.

In the inverter junction box according to the present disclosure, the knockout pin cooperates with the protection device on the inverter, which can realize the high-voltage protection when opening the cover plate of the junction box to perform wire connection, and effectively ensure the safety of operator and equipment. The wire connecting direction of the junction box can be changed by providing the connecting part with a different orientation or by rotating the casing during installation to change the orientation of connecting part.

BRIEF DESCRIPTION OF DRAWINGS

By reading the detailed description of the preferred embodiments below, various other advantages and benefits will become clear to a person of ordinary skill in the art. The accompanying drawings are only used for the purpose of illustrating the preferred embodiments, and should not be considered as a limitation to the present disclosure. Moreover, throughout the drawings, the same reference numerals are used to denote the same components. In the drawings.

Figure 1:
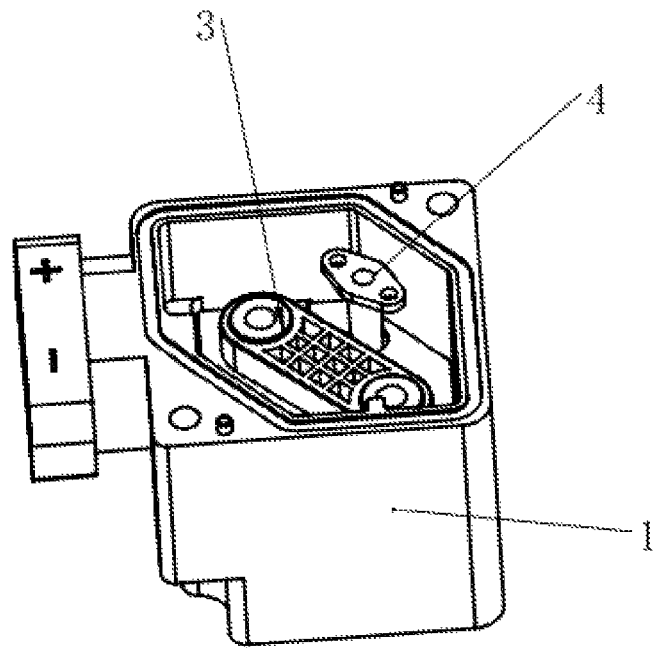
FIG. 1 is a schematic view of the structure of a junction box after removing a cover plate according to an embodiment of the present disclosure.

In the drawings: 1. casing, 2. cover plate, 3. high voltage busbar terminal, 4. knockout pin, 5. positioning hole, 6. installation hole, 7. conductive column.

DETAILED DESCRIPTION

Illustrative embodiments of the present disclosure will be described in more detail with reference to the drawings.

Although the drawings show the illustrative embodiments of the present disclosure, it should be understood that the present disclosure can be implemented in various ways and should not be limited by the embodiments disclosed herein. On the contrary, the embodiments are provided for a more thorough and complete understanding of the present disclosure, so as to fully convey the scope of the present disclosure to those skilled in the art.

An embodiment of the present disclosure provides an inverter junction box. Of course, the junction box in the present disclosure may also be used in other similar scenarios, which is not limited to the terminal connection of the inverter.

Figure 2:
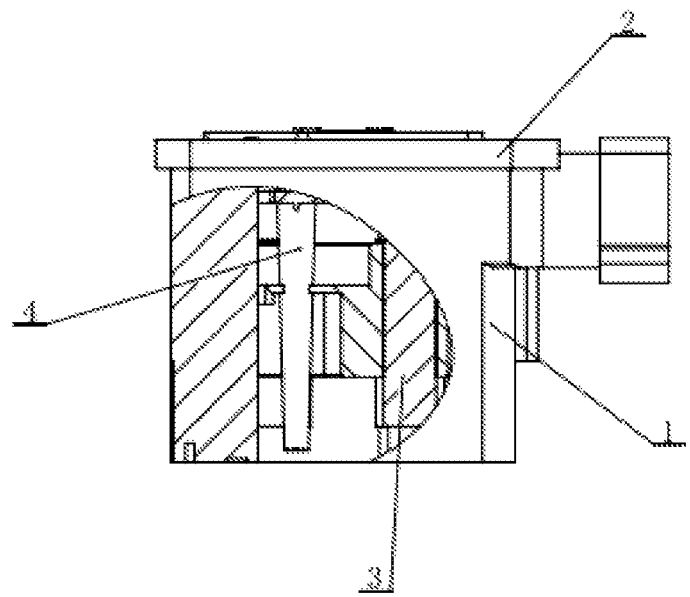
FIG. 2 is a partial sectional view of a junction box according to an embodiment of the present disclosure.
Figure 3:
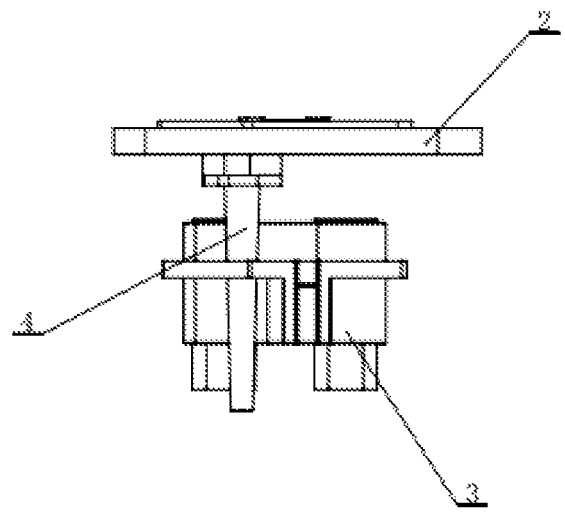
FIG. 3 is a schematic view of the structure of a junction box after removing a casing according to an embodiment of the present disclosure.

As shown in FIGS. 1-3, the inverter junction box comprises casing 1, cover plate 2 and knockout pin 4. The cover plate 2 is detachably connected with the top part of casing 1. One end of the knockout pin 4 is detachably connected to the bottom part of the cover plate 2, and the other end abuts against a protection device on the inverter. The knockout pin 4 may be connected and fixed with the cover plate 2 by screws. When the knockout pin 4 abuts against the protective device, the high-voltage protection will not be triggered. When the cover plate 2 of the junction box is opened, since the knockout pin 4 is fixedly connected with the cover plate 2, the knockout pin 4 is separated from the protective device, and at this moment the high-voltage protection will be triggered, which can effectively ensure the safety of operator and equipment.

One side of the casing 1 is equipped with a connecting part, and the external cables can be connected with the interior of the junction box via the connecting part. The bottom part of the casing 1 is a hollow structure, and abuts against the incoming terminal of the inverter. The design of the hollow structure facilitates the connection between the internal structure of the junction box and the inverter.

In an embodiment, as shown in FIGS. 1-4, the inverter junction box further comprises a high voltage busbar terminal 3.

The high voltage busbar terminal 3 comprises an insulating body and two conductive columns 7, and the conductive columns 7 are respectively inserted in the insulating body. One end of the conductive column 7 is connected with the external cable, and the other end is connected with the incoming terminal of the inverter. Its function is to realize the connection between the external cable and the inverter device. The design of the insulation body can realize the relative fixation of the two conductive columns 7. The insulation body part between the two conductive columns 7 may be a hollow structure, which facilitates heat dissipation and material saving.

In this embodiment, the design of the high-voltage busbar terminal 3 can realize the connection between the inverter device and external cables of different directions, so that the high-voltage harness of external cables is not restricted by the whole vehicle structure, and meet the requirements of multi-directional wiring of the inverter. The connection structure between the inverter device and the junction box shown in FIG. 6 does not use the high-voltage busbar terminal 3, and the external cable is directly connected with the inverter terminal after entering the connection box. The connection structure shown in FIG. 5 uses the high-voltage busbar terminal 3, the change of the wire connecting direction of the inverter device is realized, and the junction box can also realize other wire connecting directions of the inverter device.

In an embodiment, the conductive column 7 is made of copper. Of course, the conductive column 7 may also be made of other metal materials with excellent conductivity.

In an embodiment, a central part of the conductive column 7 on the high-voltage busbar terminal 3 is provided with a through hole. As can be seen from FIG. 5, the conductive column 7 is fixed on the incoming terminal of the inverter via the through hole and a bolt, so as to realize the electrical conductivity between the conductive column 7 and the incoming terminal, and the external cable is also fixedly connected with the conductive column 7 via the bolt.

In an embodiment, as shown in FIG. 1, a positioning plate is further provided in the casing 1. Holes are opened on the positioning plate at positions corresponding to the insulating body and knockout pin 4, and the insulating body and knockout pin 4 can pass through the holes. The positioning plate is used to fix the insulating body and knockout pin 4 at a middle position of the casing 1 to prevent the insulating body and knockout pin 4 from shaking in the casing 1.

In an embodiment, the casing 1 has a cylindrical shape or a regular quadrangular prism shape as a whole. The casing 1 may be designed into other shapes as required, such as a rectangle. The insulating body extends along the diameter of the cylinder or the diagonal of the regular quadrangular prism, and abuts against the casing. The two conductive columns 7 are symmetrically disposed on the diameter or the diagonal. This structure makes the insulating body more firmly fixed in the casing, and also effectively reduces the volume of the casing 1 and makes the junction box smaller as a whole.

Figure 4:
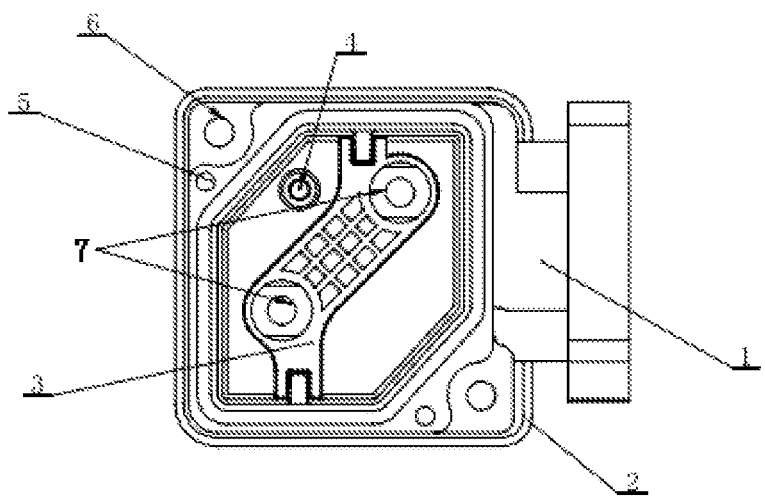
FIG. 4 is a bottom view of a junction box according to an embodiment of the present disclosure.

In an embodiment, as shown in FIG. 4, the outer end sides of the high-voltage busbar terminal 3 are provided with a number of insulating medium support protrusions, which respectively abut against the inner wall of the casing 1 to limit the position of the high-voltage busbar terminal 3 and fix it.

In an embodiment, it can be seen from FIG. 1 that the connecting part is perpendicular to the casing 1. For example, they can be arranged in an L-shape. A notch is provided at a corner of the casing 1 below the connecting part. The design of the notch can save material and reduce weight. A positive connecting hole and a negative connecting hole are provided in the connecting part, and the positive connecting hole and the negative connecting hole are communicated with the interior of the casing. The positive and negative poles of the external cable may pass through the positive and negative connecting holes respectively to connect with the conductive columns 7 or the incoming terminals of the inverter.

In an embodiment, as shown in FIGS. 1 and 4, the casing 1 is provided with a number of longitudinally penetrating installation holes 6, the cover plate 2 is also provided with installation holes 6 at corresponding positions, and the position of the installation holes 6 on the casing 1 are consistent with the position of the installation holes 6 on the cover plate 2. Screws or bolts pass through the installation holes 6 to realize the fixation between the cover plate 2 and the casing 1, as well as the fixation between the casing 1 and the inverter device.

Figure 5:
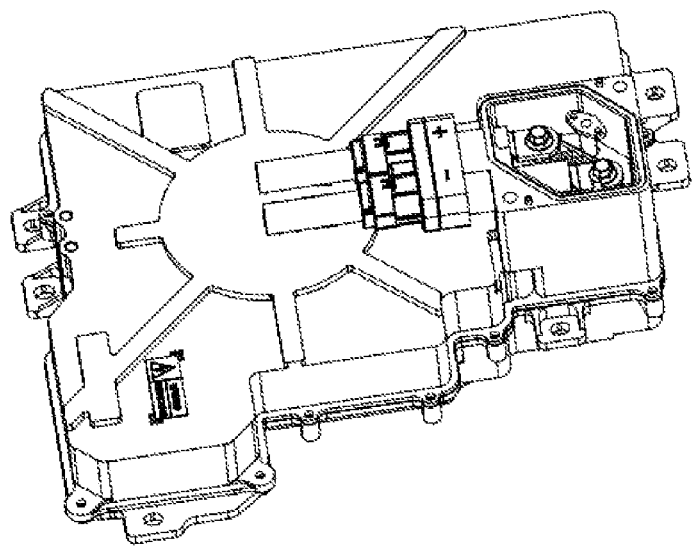
FIG. 5 is a schematic view of the application of a junction box according to an embodiment of the present disclosure.
Figure 6:
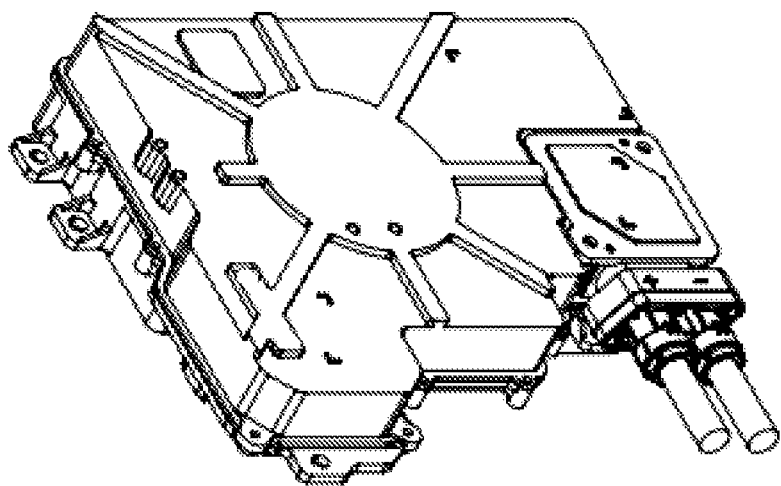
FIG. 6 is a schematic view of the application of a junction box according to an embodiment of the present disclosure.

In an embodiment, as shown in FIGS. 4 and 5, the casing 1 is provided with a positioning hole 5 that engages with a positioning column on the inverter. The positioning hole 5 may completely penetrate the casing 1. Through the engagement of the positioning hole and the positioning column, the position of the casing 1 can be fixed. Of course, the positions of the positioning hole and the positioning column may also be interchanged.

In sum, the present disclosure discloses an inverter junction box. The inverter junction box comprises a casing, a cover plate and a knockout pin. One end of the knockout pin is detachably connected to the bottom part of the cover plate, and the other end abuts against the protective device on the inverter. One side of the casing is provided with a connecting part, and the bottom part of the casing is a hollow structure. In the inverter junction box according to the present disclosure, the knockout pin cooperates with the protection device on the inverter, which can realize the high-voltage protection when opening the cover plate of the junction box to perform wire connection, and effectively ensure the safety of operator and equipment. In a junction box according to an embodiment of the present disclosure, by providing a high-voltage busbar terminal, the connection between the inverter and cables of different directions can be realized, and the requirements of multi-directional wiring of the inverter can be met.

The above is only the specific embodiments of the invention. Under the above teaching of the invention, those skilled in the art can make other improvements or modifications on the basis of the above embodiments. Those skilled in the art should understand that the above specific description is only to better explain the invention, and the protection scope of the invention should be subject to the protection scope of the claims.

What is claimed is:

1. An inverter junction box comprising:
   a casing;
   a cover plate that is detachably connected with a top part of the casing;
   a knockout pin having a first end that is detachably connected with a bottom part of the cover plate, and a second end configured to abut against a protection device on an inverter; and
   a high-voltage busbar terminal that includes an insulating body and two conductive columns that are respectively inserted in the insulating body,
   wherein:
     one side of the casing includes a connecting part that is connected with an external cable, and
     a bottom part of the casing is a hollow structure and abuts against an incoming terminal of the inverter,
     in a first orientation of the inverter junction box, the incoming terminal of the inverter is connected to the external cable via the two conductive columns of the high-voltage busbar terminal,
     in a second orientation of the inverter junction box, the external cable is directly connected with the incoming terminal of the inverter after entering the inverter junction box and does not use the high-voltage busbar terminal, and
     when the knockout pin abuts against the protection device, high-voltage protection will not be triggered, when the cover plate of the inverter junction box is opened, so that the knockout pin is fixedly connected with the cover plate and separated from the protection device, the high-voltage protection will be triggered.

2. The inverter junction box according to claim 1, wherein the two conductive columns are made of copper.

3. The inverter junction box according to claim 1, wherein a through hole is provided in a central part of at least one of the two conductive columns, and the high-voltage busbar terminal is configured to be connected to the incoming terminal of the inverter via the through hole and a bolt.

4. The inverter junction box according to claim 1, wherein the casing is further provided therein with a positioning plate for fixing the insulating body and the knockout pin at a middle position of the casing.

5. The inverter junction box according to claim 1, wherein the casing has a cylindrical shape or a regular quadrangular prism shape as a whole, the insulation body extends along a diameter of the cylindrical shape or a diagonal of the regular quadrangular prism shape with two ends abutting against the casing, and the two conductive columns are symmetrically provided on the diameter or the diagonal.

6. The inverter junction box according to claim 1, wherein outer end sides of the high-voltage busbar terminal are provided with a number of insulating medium support protrusions.

7. The inverter junction box according to claim 1, wherein the connecting part and the casing are arranged to be perpendicular to each other, the connecting part is provided therein with a positive connecting hole and a negative connecting hole, and the positive connecting hole and the negative connecting hole are communicated with an interior of the casing.

8. The inverter junction box according to claim 1, wherein the casing is provided thereon with a number of longitudinally penetrating installation holes, and the cover plate is also provided with installation holes at corresponding positions.

9. The inverter junction box according to claim 1, wherein the casing is provided thereon with a positioning hole engaging with a positioning column on the inverter, or the casing is provided with a positioning column engaging with a positioning hole on the inverter.

* * * * *